(12) United States Patent
Zhang et al.

(10) Patent No.: US 10,770,574 B2
(45) Date of Patent: Sep. 8, 2020

(54) SEMICONDUCTOR DEVICE AND METHOD FOR MANUFACTURING THE SAME

(71) Applicant: DYNAX SEMICONDUCTOR, INC., Kunshan, Jiangsu Province (CN)

(72) Inventors: Naiqian Zhang, Kunshan (CN); Xingxing Wu, Kunshan (CN); Xinchuan Zhang, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 0 days.

(21) Appl. No.: 16/463,742

(22) PCT Filed: Oct. 16, 2018

(86) PCT No.: PCT/CN2018/110419
§ 371 (c)(1),
(2) Date: May 23, 2019

(87) PCT Pub. No.: WO2019/076299
PCT Pub. Date: Apr. 25, 2019

(65) Prior Publication Data
US 2019/0386126 A1    Dec. 19, 2019

(30) Foreign Application Priority Data
Oct. 16, 2017    (CN) .......................... 2017 1 0959834

(51) Int. Cl.
*H01L 29/778*    (2006.01)
*H01L 29/66*    (2006.01)

(52) U.S. Cl.
CPC ...... *H01L 29/778* (2013.01); *H01L 29/66431* (2013.01)

(58) Field of Classification Search
CPC ............. H01L 29/778; H01L 29/66431; H01L 29/4175; H01L 29/2003; H01L 29/41758; H01L 29/812
See application file for complete search history.

(56) References Cited

U.S. PATENT DOCUMENTS

| | | | |
|---|---|---|---|
| 9,779,988 B2 * | 10/2017 | Hill | H01L 29/735 |
| 9,923,059 B1 * | 3/2018 | Tu | H01L 23/49524 |
| 9,929,107 B1 * | 3/2018 | Birner | H01L 23/562 |
| 9,991,373 B1 * | 6/2018 | Birner | H01L 21/76846 |
| 10,128,230 B2 * | 11/2018 | Shirakawa | H01L 29/407 |
| 2010/0320505 A1 * | 12/2010 | Okamoto | H01L 29/41766 257/192 |

(Continued)

*Primary Examiner* — Victor A Mandala
(74) *Attorney, Agent, or Firm* — Armstrong Teasdale LLP

(57) ABSTRACT

Embodiments of the present disclosure provide a semiconductor device and a method for manufacturing the same. The semiconductor device includes an active region and an inactive region located outside of the active region, the semiconductor device including a substrate, a semiconductor layer including a first semiconductor layer located in the active region and a second semiconductor layer located in the inactive region, a source, a drain, and a gate. A via hole penetrated through the substrate and the semiconductor layers below the source is provided below the source. A part of the via hole is located in the second semiconductor layer of the inactive region and penetrates at least one part of the second semiconductor layer.

20 Claims, 6 Drawing Sheets

(56) References Cited

U.S. PATENT DOCUMENTS

| | | | |
|---|---|---|---|
| 2010/0327349 A1* | 12/2010 | Arie | H01L 29/66659 |
| | | | 257/340 |
| 2014/0131871 A1* | 5/2014 | Tsai | H01L 21/2885 |
| | | | 257/750 |
| 2015/0311332 A1* | 10/2015 | Zhang | H01L 23/488 |
| | | | 257/76 |
| 2017/0236931 A1* | 8/2017 | Meiser | H01L 29/1095 |
| | | | 257/334 |
| 2018/0138132 A1* | 5/2018 | Nishizawa | H01L 21/4817 |
| 2018/0152657 A1* | 5/2018 | Miyazawa | H01L 27/14636 |
| 2018/0212047 A1* | 7/2018 | Chang | H01L 21/743 |

* cited by examiner

SEMICONDUCTOR DEVICE AND METHOD FOR MANUFACTURING THE SAME

CROSS REFERENCE TO RELATED APPLICATIONS

This patent application is a National Stage Entry of PCT/CN2018/110419 filed on Oct. 16, 2018, which claims the benefit and priority of Chinese Patent Application No. 201710959834.9 filed on Oct. 16, 2017, the disclosures of which are incorporated by reference herein in their entirety as a part of the present application.

BACKGROUND

The present disclosure relates to a field of semiconductor technology, and particularly relates to a semiconductor device and a method for manufacturing the same.

Compared with the first-generation semiconductor of silicon and the second-generation semiconductor of gallium arsenide, the semiconductor material of gallium nitride has many advantages such as large band gap, high electron saturation drift velocity, high breakdown field strength, and ability of withstanding high temperature, which makes it more suitable for making electronic devices having high temperature, high pressure, high frequency, and high power. Due to the above-mentioned advantages, gallium nitride has broad application prospects and becomes hot research topic in the field of semiconductor industry.

Gallium nitride High Electron Mobility Transistor (HEMT) is a gallium nitride device formed using two-dimensional electron gas at AlGaN/GaN heterojunction and can be applied to the field of high frequency, high voltage, and high power. During the packaging process of gallium nitride devices, a via hole structure is generally used to increase the gain of the devices and reduce grounding resistance.

At present, there are mainly two forms of position distribution of via holes of a gallium nitride device. One form is to provide via holes in the source metal PAD area at the same side of the active region. The other form is to provide the via holes below the source of the active region such that the source in each active region is directly grounded through the via holes. Such a structure reduces the source-to-ground distance in the active region, thereby reducing the grounding resistance.

With the development of machine intelligence, the size requirements for chips are more prominent, so the smaller chip size has become a problem that the modern semiconductor industry has been paying attention to. In the current field of gallium nitride semiconductors, when a device having a small gate width is required, the distance between the via holes is usually reduced, which will result in greatly reduced heat dissipation performance of the device, and may even cause mutual inductance, which affects the device performances.

BRIEF DESCRIPTION

In view of this, embodiments of the present disclosure provide a semiconductor device and a method for manufacturing the same, to solve the problem above.

The present disclosure provides the following technical solutions.

The present disclosure provides a semiconductor device. The semiconductor device includes an active region and an inactive region located outside of the active region, the semiconductor device including a substrate, a semiconductor layer formed at a side of the substrate, the semiconductor layer including a first semiconductor layer located in the active region and a second semiconductor layer located in the inactive region, a source, a drain, and a gate formed in the active region and located at a side of the semiconductor layer away from the substrate, the second semiconductor layer being located in the inactive region close to at least one end of the source, and a via hole penetrated through the substrate, at least a part of the first semiconductor layer, and at least a part of the second semiconductor layer.

Further, a projection of the via hole on a plane of the substrate partially overlaps a projection of the source on the plane of the substrate.

Further, at least one end of the source is disposed as a concave structure, and a projection of the via hole on a plane of the substrate does not overlap or partially overlaps a projection of the source on the plane of the substrate.

Further, an interconnecting metal layer is disposed on a surface of the source and the second semiconductor layer away from the substrate.

Further, a barrier layer is disposed at a side of the first semiconductor layer and the second semiconductor layer away from the substrate at a position corresponding to the via hole.

Further, an interconnecting metal layer is disposed on a surface at a side of the source, the second semiconductor layer, and the barrier layer away from the substrate.

Further, the source is formed on a surface at a side of the semiconductor device away from the substrate, or a recess for accommodating the source is disposed at a side of the semiconductor layer away from the substrate, the source being located in the recess.

Further, the source is formed in the recess, and a height difference between a bottom surface of the via hole located in the second semiconductor layer and a surface of the semiconductor layer away from the substrate is smaller than or equal to 250 nm.

Further, each of two ends of the source is provided with one said via hole, and a distance between two said via holes provided at two end edges of the source is greater than or equal to a quarter of a width of the gate.

Further, one-sixth to five-sixths of the volume of the via hole is located in the second semiconductor layer.

Further, an edge of the second semiconductor layer is arc-shaped.

Further, the second semiconductor layer is a portion of the semiconductor layer in a region where the interconnecting metal layer and the inactive region overlap.

The present disclosure further provides a method for manufacturing a semiconductor device, including providing a substrate, forming semiconductor layers at a side of the substrate to form an active region and an inactive region, the semiconductor layers including a first semiconductor layer located in the active region and a second semiconductor layer located in the inactive region, forming a source, a drain, and a gate in the active region, at a side of the semiconductor layer away from the substrate, forming an interconnecting metal layer at a side of the source away from the semiconductor layer and a side of the second semiconductor layer away from the substrate, and forming a via hole penetrated through the substrate, at least a part of the first semiconductor layer, and at least a part of the second semiconductor layer from a side of the substrate away from the semiconductor layers.

Further, the method further includes prior to forming the interconnecting metal, forming an etching stopping layer at a side of the semiconductor layers away from the substrate, the etching stopping layer being located above the via hole.

In the embodiment of the present disclosure, the via holes are provided below the source and a part thereof is located in the inactive region, so that when a small-sized device is made, as a part of the via holes is in the inactive region, even if the distance between the via holes is reduced due to the reduction in the size of the device, it still may satisfy the size requirement of the device, and the device size may be reduced without increasing the process difficulty. At the same time, it does not affect the heat dissipation of the device, nor does it increase the grounding inductance, and meanwhile it may improve the performance of the device.

To make the features and advantages of the present disclosure more manifest and understandable, example embodiments will be described in detail in conjunction with the appending drawings.

BRIEF DESCRIPTION OF THE DRAWINGS

In order to illustrate the technical solutions of the embodiments of the present disclosure more clearly, drawings to be used in the embodiments will be briefly described below. It should be appreciated that the following drawings illustrate only certain embodiments of the present disclosure, and thus they should not be seen as limiting the scope. Other relevant drawings may also be obtained by those skilled in the art according to these drawings without exercise of inventive skills.

DETAILED DESCRIPTION

Figure 1:
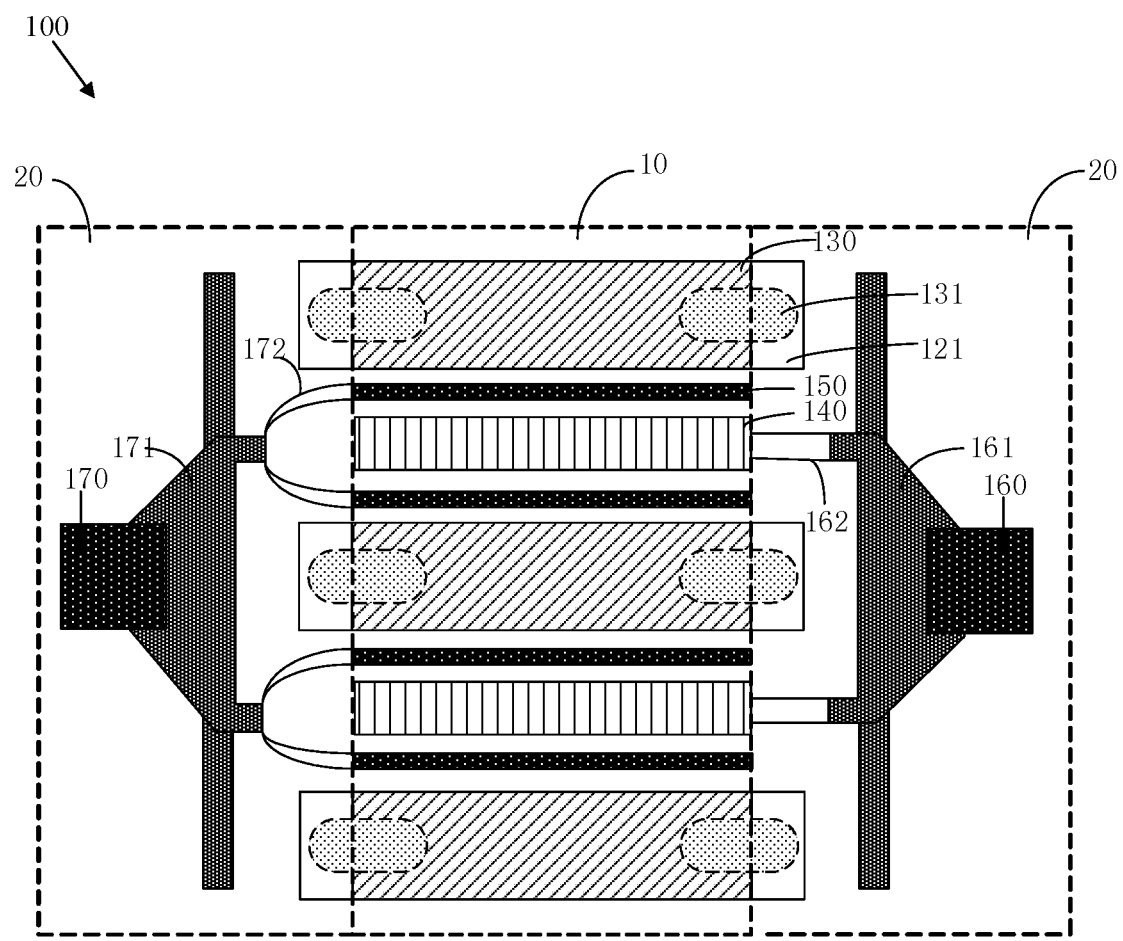
FIG. 1 is a schematic diagram of a semiconductor device according to an embodiment of the present disclosure.

The technical solutions in the embodiments of the present disclosure will be clearly and completely described in the following with reference to the accompanying drawings. Obviously, the described embodiments are only a part, other than all, of the embodiments of the disclosure. The components of the embodiments of the disclosure, which are described and illustrated in the drawings herein, may generally be arranged and designed in various different configurations. Therefore, the following detailed description of the embodiments of the disclosure in the drawings is not intended to limit the scope of the present disclosure, but merely refers to example embodiments of the present disclosure. All other embodiments obtained by those skilled in the art based on the embodiments of the present disclosure without exercise of inventive skills are within the scope of the present disclosure.

It should be noted that similar reference numerals and letters indicate similar items in the following drawings. Therefore, once an item is defined in a drawing, it is not necessary to further define and explain it in the subsequent drawings.

The inventors have found that the structure in which the via holes are provided in the metal PAD region reduces the influence of the via holes on the heat dissipation of the device, but causes the whole flow direction of the current of the active region to be the same and not dispersed, resulting in mutual inductance between the metal fingers of the active region. In addition, such a structure increases the source-to-ground distance in the active region, that is, increases the grounding resistance of the source, thereby affecting the performances such as gain of the device. If the diameter of the via hole is reduced in order to reduce the size of the device, the grounding inductance of the device is directly increased, and the process difficulty is greatly increased, which is not conducive to production applications.

Figure 2:
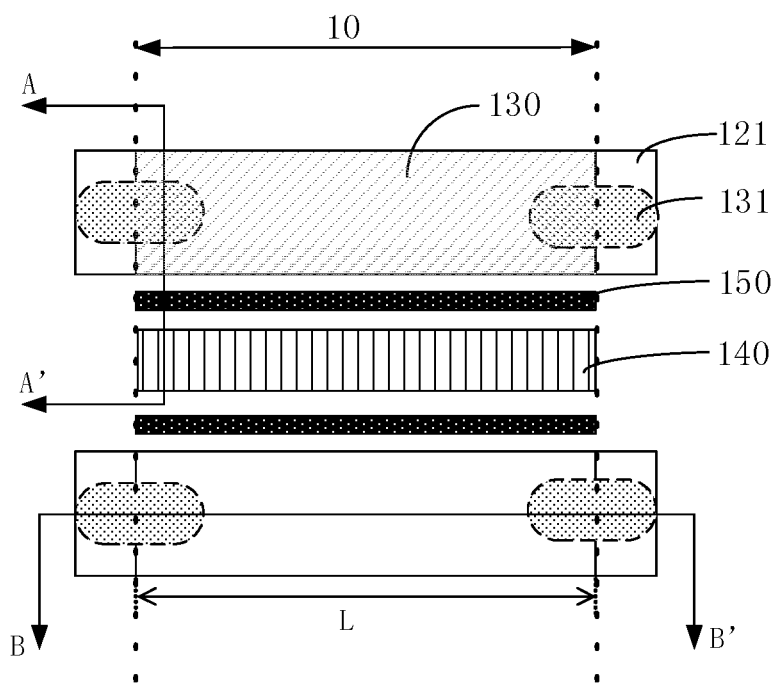
FIG. 2 is a schematic diagram of a portion of a source, a drain, and a gate in a semiconductor device according to an embodiment of the present disclosure.
Figure 3:
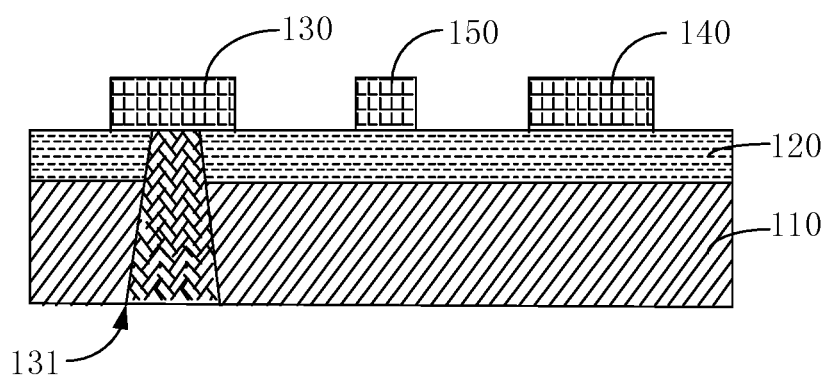
FIG. 3 is a schematic cross-sectional diagram in the direction of AA' of FIG. 2.

In view of this, an embodiment of the present disclosure provides a semiconductor device 100. As shown in FIGS. 1 to 3, the semiconductor device 100 includes a substrate 110, a semiconductor layer 120, a source 130, a drain 140, and a gate 150.

Referring to FIG. 1, the semiconductor device 100 includes an active region 10 and an inactive region 20. The semiconductor layer 120 includes a first semiconductor layer in the active region 10 and a second semiconductor layer 121 in the inactive region 20. The second semiconductor layer 121 is a semiconductor layer of a certain area in the inactive region 20 close to at least one end of the source. The first semiconductor layer is a working region of the semiconductor device 100 where a two-dimensional electron gas, electrons, or holes exist below the active region 10. The second semiconductor layer is not an inner working region of the semiconductor device 100 and where the two-dimensional electron gas, electrons, or holes below the inactive region 20 are eliminated or isolated by a MESA etching process, an ion injection process or an oxidation isolation process.

Referring to FIG. 3, the substrate 110 may be formed of one material of silicon, sapphire, silicon carbide, gallium arsenide, and the semiconductor layer 120 may be formed of one or a combination of gallium nitride, aluminum gallium nitride, or indium gallium nitride. In the process of forming the semiconductor layer 120, at least a part of the via hole 131 is made to penetrate through the second semiconductor layer 121 of a certain area in the inactive region 20 close to one end or both ends of the source 130.

The source 130, the drain 140, and the gate 150 are formed at a side of the semiconductor layer 120 away from the substrate 110. The source 130 and the drain 140 may be a metal material or a composite material of a plurality of metal materials. The gate 150 may be a single-layer metal gate or a structure of a stack of a two-layer metal or multi-layer gate. The source 130 and the drain 140 may be ohmic contact electrodes, and the gate 150 may be a Schottky contact electrode. The source 130 and the drain 140 may be alternately disposed, and the gate 150 is distributed in an interdigitated form between the source 130 and the drain 140.

As further shown in FIGS. 1 to 4, the semiconductor device 100 further includes a via hole corresponding to the source and penetrating through the substrate 110 and at least a part of the semiconductor layer. In a specific embodiment, the source 130 may be formed on a surface of a side of the semiconductor layer 120 away from the substrate 110, and the projection of the via hole 131 on the plane of the substrate 110 partially overlaps the projection of the source 130 on the plane of the substrate. The source 130 may be a strip shape, and the via hole 131 penetrates through the semiconductor layer 120 below the source 130. At the same time, the via hole 131 may penetrate through the second semiconductor layer 121.

A plurality of sources 130, a plurality of drains 140, and a plurality of gates 150 may be disposed in the active region 10 of the semiconductor device 100. Correspondingly, each of the sources 130 may be provided with the via holes 131 whose number may be determined according to actual requirements. A part of the via hole 131 in the embodiment of the present disclosure is located in the second semiconductor layer 121, that is, a part of the via hole 131 is located in the second semiconductor layer 121 in the inactive region 20. The via hole 131 may be provided at two ends of the source 130 respectively, and the two via holes 131 are both partially located in the second semiconductor layer 121 of the inactive region 20, so that even if the two via holes 131 are closer to each other in order to reduce the size of the device, by placing a part of the via hole 131 in the inactive region 20 and controlling the spacing between the two via holes 131, there is no mutual inductance generated between the two via holes 131.

Figure 5:
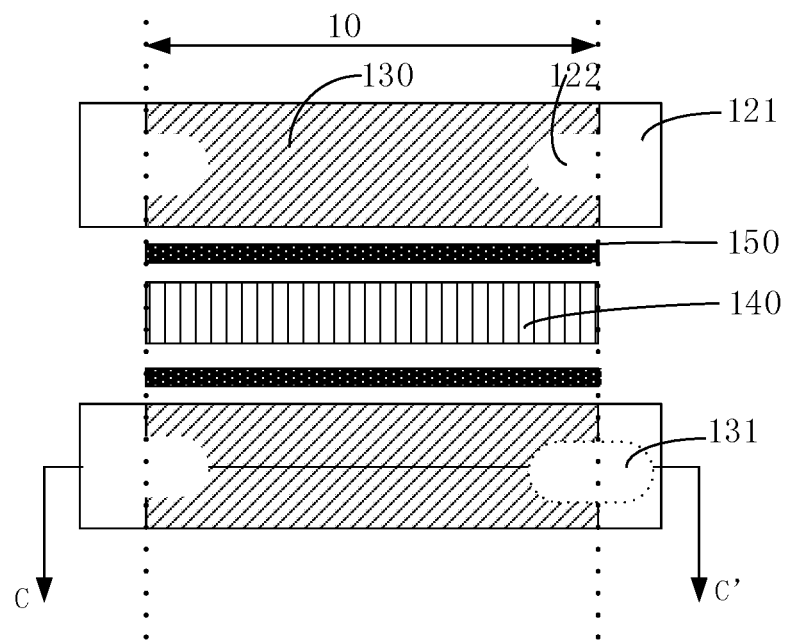
FIG. 5 is another schematic diagram of a portion of a source, a drain, and a gate of a semiconductor device according to an embodiment of the present disclosure.

It may be appreciated that, in the process of fabricating the ohmic metal to form the source 130, the ohmic metal may cover only the source region in the active region 10, or it may also cover the region of the second semiconductor layer 121 of the inactive region 20. The top view shape of the source 130 may be a strip shape with regular four sides (for example, as shown by the structure 130 in FIG. 2). When the ohmic metal covers only the source area in the active region 10, the source 130 may also have a concave structure matching the shape of the via hole 131 in the active region at one end or both ends close to the inactive region 20. The shape of the semiconductor layer 122 exposed from the concave structure is the same as the shape of the via hole 131 formed later, and the area of the semiconductor layer 122 is larger than or equal to the cross-sectional area of the via hole 131 in the active region 10 (for example, as shown in FIG. 5). The projection of the via hole 131 on the plane of the substrate does not overlap or partially overlaps the projection of the source 130 on the plane of the substrate.

After the ohmic metal fabrication is completed, a barrier layer 132 may be formed at a side of the semiconductor layer 120 away from the substrate 110 at a position corresponding to the via hole 131. The shape of the barrier layer 132 matches the cross section shape of the via hole 131 and the area is larger than or equal to the area of the contact surface of the via hole 131 at the location. The material of the barrier layer 132 may employ one metal or a composite material of a plurality of metals; for example, the barrier layer may be formed by using one or a combination of gold, tungsten, platinum, titanium, and nickel metal. Certainly, this step may also be omitted to directly fabricate the interconnecting metal layer 133. The interconnecting metal layer 133 may cover over the source 130 in the active region 10 of the semiconductor layer 120 away from the substrate 110, and over the second semiconductor layer 121 of the inactive region 20. If the source 130 has a concave structure, the interconnecting metal layer 133 simultaneously covers the semiconductor layer 122 exposed from the concave structure. The second semiconductor layer in the inactive region may be a part of the semiconductor layer 120 in a region where the interconnecting metal layer 133 and the inactive region overlap.

The via hole 131 may be filled with at least one conductive material, such as gold, alloy of gold and tin, etc., and the conductive material may be electrically connected to the source electrode. Alternatively, the source 130 may be grounded by filling the conductive material. Alternatively, a layer of interconnecting metal may be formed at a side of the source 130 away from the semiconductor layer 120 and a side of the second semiconductor layer 121 away from the substrate 110, so that the source 130 and the via hole 131 form an electrical connection to achieve a grounding arrangement. The shape of the cross section of the via hole 131 may be any shape such as a circle, an ellipse, a square, a waist, or the like. The shape of the longitudinal section of the via hole 131 may be trapezoidal, square, or of any shape that is readily achievable by other processes.

Figure 4:
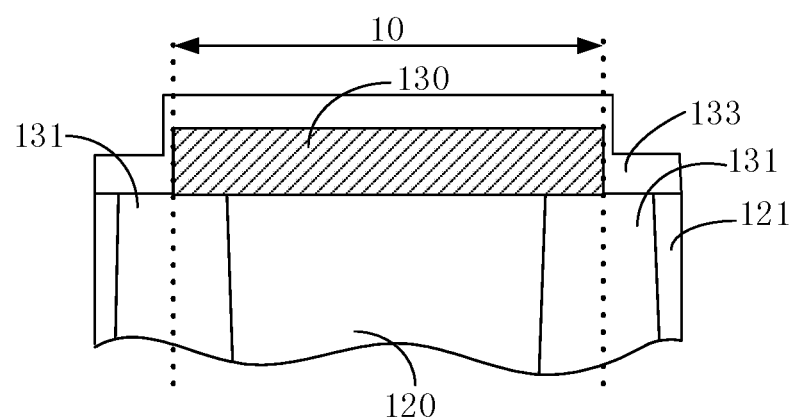
FIG. 4 is a schematic cross-sectional diagram in the direction of BB' of FIG. 2.

As shown in FIGS. 2 and 4, the via holes 131 are provided below two ends of each of the source electrodes 130. The gate width L may also be changed correspondingly according to the different size of the semiconductor device 100. Alternatively, the distance between the nearest boundaries of the two via holes 131 is greater than or equal to a quarter of the gate width L. In order to improve the heat dissipation performance and reduce the mutual inductance, the distance between the nearest boundaries of the two via holes 131 is greater than or equal to a quarter of the gate width L and smaller than or equal to three quarters of the gate width L. Alternatively, when the distance between the nearest boundaries of two via holes 131 of the same source 130 may be less than a quarter of the gate width L, range of the width of the second semiconductor layer 121 located in the inactive region 20 in the gate width direction may be from one-sixth to five-sixths of the length of the via hole, and the length of the via hole here is the distance between two farthest points on the plane of the via hole 131 closest to the source 130 in the gate width direction. In order to ensure the superior performances such as heat dissipation of the device while reducing the size of the device, the width of the second semiconductor layer 121 in the gate width direction may be one-third to two-thirds of the length of the via hole.

Alternatively, one-sixth to six-sixths of the volume of the via hole 131 is located in the active region 10, and the remaining part of the via hole 131 is located in the inactive region 20, which means that the via hole 131 is located in the second semiconductor layer 121 of the inactive region 20. The edge of the second semiconductor layer 121 in contact with the inactive region 20 may be formed into a curved corner or a chamfered corner. The shape of the curved corner or chamfered corner may effectively alleviate the tip discharge and improve device performances.

Figure 6:
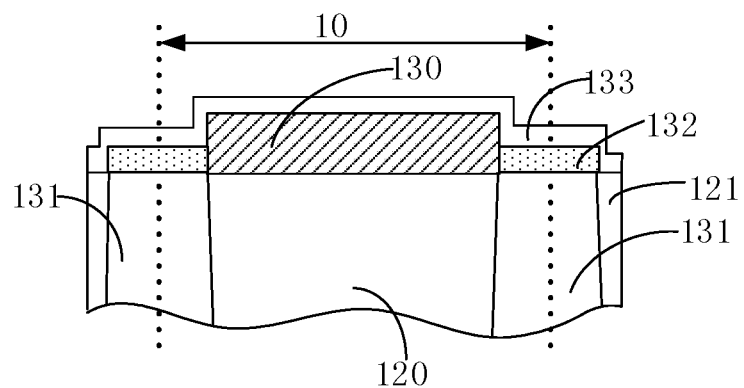
FIG. 6 is a schematic cross-sectional diagram in the direction of CC' of FIG. 5.

In one embodiment, as shown in FIGS. 5 and 6, FIG. 6 is a schematic cross-sectional diagram in the direction of CC' of FIG. 5. The source is formed on a surface at a side of the semiconductor layer away from the substrate, and the ohmic metal may cover only the source pattern area in the active region 10. Two ends of the source 130 close to the inactive region 20 have a concave structure that matches the shape of the via hole 131 in the active region, and the shape of the semiconductor layer 122 exposed from the concave structure is the same with the shape of the via hole 131 in the active region 10 or it has a slightly larger area. Alternatively, the cross section of the via hole 131 may be elliptical or waist shaped, and the source 130 has an arc shape matching the one end of the via hole 131 in the active region 10, so that both ends of the source 130 are formed with an arc shaped concave structure. It may be appreciated that the curvature of the concave structure can match the curvature of the via hole 131. As shown in FIG. 6, a part of the via hole 131 located in the second semiconductor layer 121 may penetrate through the second semiconductor layer 121. In order to avoid the influence from stability of the metal of the source 130 or occurrence of damage when the via hole 131 is etched, an etching stopping layer 132 having the same shape as the cross-sectional view of the via hole 131 may be set in advance in the corresponding position of the via hole 131 after the source 130 is formed. The material of the etching stopping layer may be a metal or a composite of a plurality of metals, so that and the source 130 is connected to the conductive material in the via hole 131 through the etching stopping layer 132. Alternatively, an interconnecting metal layer 133 may be formed at a side of the source 130 away from the semiconductor layer 120 and a side of the second semiconductor layer 121 away from the substrate 110, so that the source 130 is connected to the conductive material in the via hole 131 through the interconnecting metal layer 133 to achieve grounding of the source 130.

Figure 7:
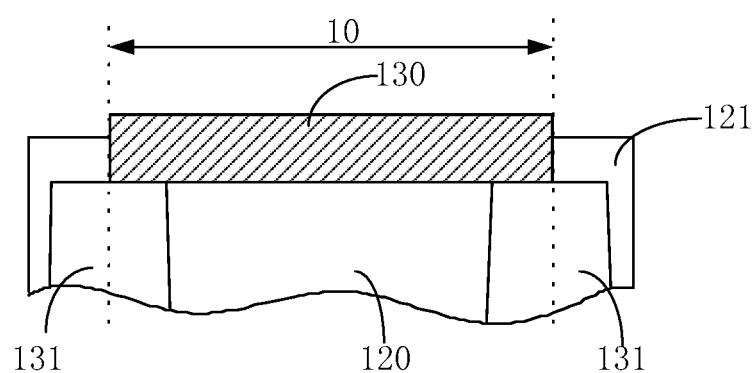
FIG. 7 is a schematic cross-sectional diagram in which the source is the inside of an etching semiconductor layer in a semiconductor device according to an embodiment of the present disclosure.

In another specific embodiment, as shown in FIG. 7, the semiconductor layer 120 is provided with a recess for accommodating the source, and the source is located in the recess. The via hole 131 is provided on at least one end of the source 130, and the via hole 131 partially overlaps the source 130. In the foregoing embodiment, the source 130 may be directly formed on a surface of the semiconductor layer 120 away from the substrate 110 side. When the source 130 is formed in the recess, the via hole 131 partially overlaps the source 130, and the bottom surface of the via hole 131 in the second semiconductor layer 121 may have a height difference from a surface of the semiconductor layer 120 away from the substrate 110, and the height difference is smaller than or equal to 250 nm.

As shown in FIG. 1 again, the semiconductor device 100 in the embodiment of the present disclosure may further include a gate pad 170 and a drain pad 160. The gate pad 170 may be located in the inactive region 20 and connected to the gate 150 through a gate interconnecting metal 171 and a gate interconnecting line 172. The drain pad 160 may be connected to the drain 140 through a drain interconnecting metal 161 and a drain interconnecting line 162. The gate interconnecting line 172 and the drain interconnecting line 162 may be made of a metal or other materials, which is not limited in the embodiment of the present disclosure. The semiconductor device 100 may include a plurality of gate pads 170, a plurality of drain pads 160, a plurality of gate interconnecting metals 171, a plurality of drain interconnecting metals 161, a plurality of gate interconnecting lines 172, and a plurality of drain interconnecting lines 162.

Figure 8:
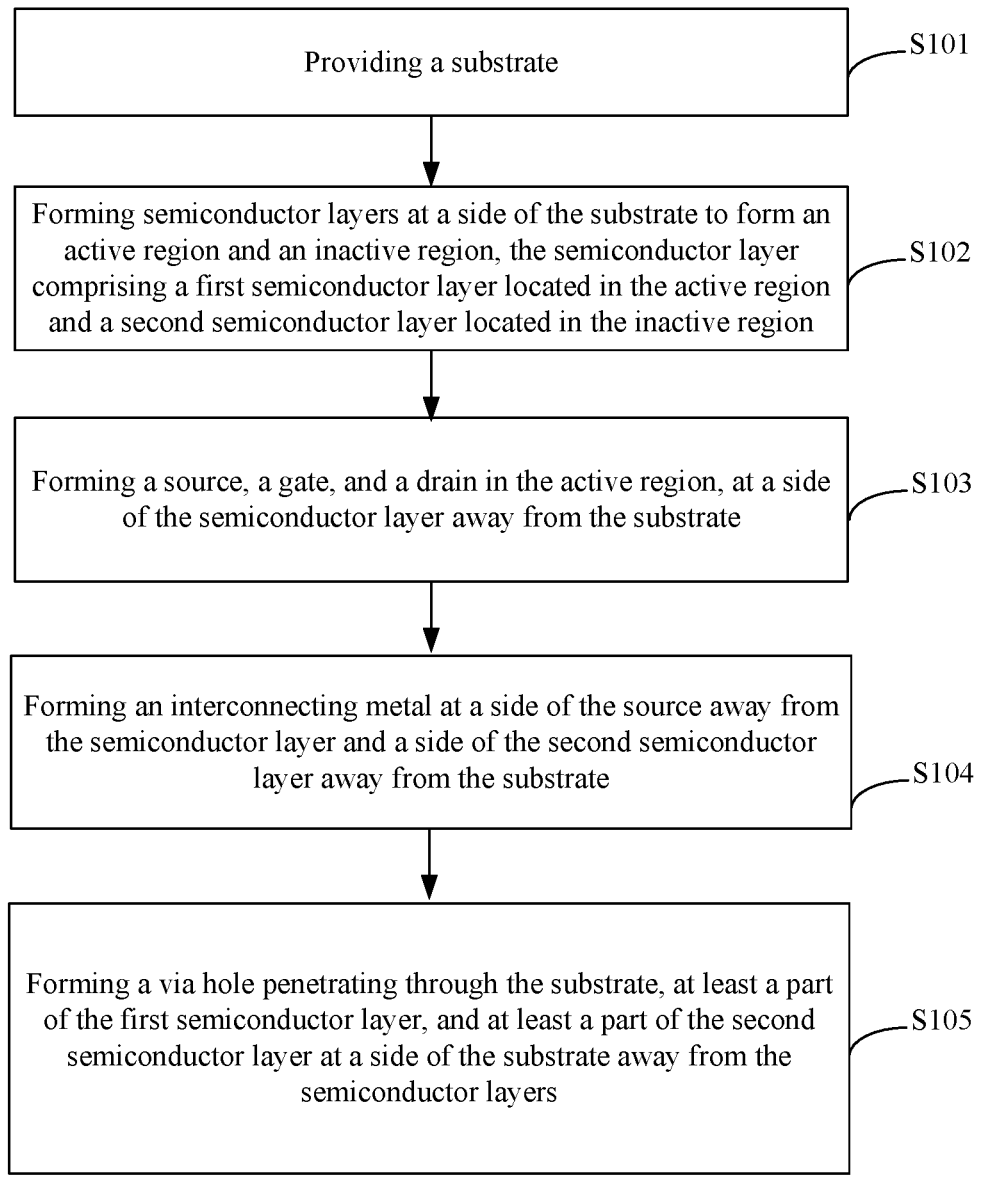
FIG. 8 is a schematic flow chart of a method for manufacturing a semiconductor device according to an embodiment of the present disclosure.

The embodiment of the present disclosure further provides a method for manufacturing a semiconductor device 100, as shown in FIG. 8, including the following steps.

Step S101, providing a substrate.

Step S102, forming semiconductor layers at a side of the substrate to form an active region and an inactive region, taking the semiconductor layer of a certain area in the inactive region close to at least one end of the source as a second semiconductor layer.

As for the semiconductor layer of the inactive region, the two-dimensional electron gas located underneath is eliminated or isolated by a mesa etching process (MESA etch), an ion injection process, or an oxidation isolation process.

Step S103, forming a source, a drain, and a gate in the active region, at a side of the semiconductor layer away from the substrate.

The source 130, the drain 140, and the gate 150 may be formed by a process such as photolithography, deposition, or etching, or after the source 130 and the drain 140 are formed, the gate 150 may be formed after the two-dimensional electron gas corresponding to the inactive region is removed by an ion injection process or an oxidation isolation process.

Step S104, forming an interconnecting metal layer at a side of the source away from the semiconductor layer and a side of the second semiconductor layer away from the substrate, so that the source is connected to the via hole formed later by the interconnecting metal.

Prior to forming the interconnecting metal, an etching stopping layer material may be formed at a side of the semiconductor layers away from the substrate, and the etching stopping layer material is located above the via hole formed later and forms an electrical connection with the source. By providing the etching stopping layer material, it can prevent damage to other structures when the via hole 131 is etched.

Step S105, forming a via hole corresponding to the source and penetrating through the substrate, at least a part of the semiconductor layer, and at least a part of the second semiconductor layer in the inactive region from a side of the substrate away from the semiconductor layers.

The structure of the via hole can be as described in the foregoing embodiment, and details are not described herein any more. The substrate 110 may be subjected to a process such as thinning, grinding, and polishing prior to forming the via holes. In addition, a back metal layer may be formed at a side of the substrate 110 away from the semiconductor layer 120, so that the source 130 may be connected to the back metal through a conductive material filled in the via hole 131 to achieve grounding of the source 130.

In summary, in the embodiment of the present disclosure, a part of the via hole is located in the inactive region, so that when a small-sized device is made, as a part of the via holes is in the inactive region, even if the distance between the via holes is reduced due to the reduction in the size of the device, it still may satisfy the size requirement of the device, and the device size may be reduced without increasing the process difficulty. At the same time, it does not affect the heat dissipation of the device, nor does it increase the grounding inductance, and meanwhile it may improve the performance of the device.

It should also be noted that in the description of the present disclosure, unless specified or limited otherwise, the terms "set", "mounted", "connected" and "coupled" are used broadly, and may be, for example, fixed connections, detachable connections, or integral connections; may also be mechanical or electrical connections; may also be direct connections or indirect connections via intervening structures; may also be inner communications of two elements. Those skilled in the art can understand the specific meaning of the above terms in the present disclosure as the case may be.

It should be noted that similar reference numerals and letters indicate similar items in the following drawings. Therefore, once an item is defined in a drawing, it is not necessary to further define and explain it in the subsequent drawings.

In the description of the present disclosure, it should be noted that the orientation or positional relationship indicated by the terms such as "central", "upper", "lower", "left", "right", "vertical", "horizontal", "inner", and "outer" is based on the orientation or positional relationship shown in the drawings, or the orientation or positional relationship conventionally placed when the product of the present disclosure is used. The terms are only for the convenience of describing the present disclosure and simplifying the description, instead of indicating or implying that the device or component referred to must have a particular orientation, constructed and operated in a particular orientation, so they are not to be construed as limiting the disclosure. Moreover, the terms "first", "second", "third" etc. are used merely for distinction in the description, and they are not to be construed as indicating or implying a relative importance.

The above description refers only to example embodiments of the present disclosure, and is not intended to limit the present disclosure. For those skilled in the art, various modifications and changes can be made to the present disclosure. Any modifications, equivalent substitutions, improvements, etc. made within the spirit and scope of the present disclosure are intended to be included within the scope of the present disclosure.

What is claimed is:

1. A semiconductor device, wherein the semiconductor device comprises an active region and an inactive region located outside of the active region, the semiconductor device comprising:
   a substrate;
   a semiconductor layer formed at a side of the substrate, the semiconductor layer comprising a first semiconductor layer located in the active region and a second semiconductor layer located in the inactive region;
   a source, a drain, and a gate formed in the active region and located at a side of the semiconductor layer away from the substrate, the second semiconductor layer located in the inactive region close to at least one end of the source; and
   a via hole penetrated through the substrate, at least a part of the first semiconductor layer, and at least a part of the second semiconductor layer.

2. The semiconductor device according to claim 1, wherein a projection of the via hole on a plane of the substrate partially overlaps a projection of the source on the plane of the substrate.

3. The semiconductor device according to claim 2, wherein one of i) the source is formed on a surface at a side of the semiconductor device away from the substrate, and ii) a recess for accommodating the source is disposed at a side of the semiconductor layer away from the substrate, the source located in the recess.

4. The semiconductor device according to claim 2, wherein each of two ends of the source is provided with one said via hole, and a distance between two said via holes provided at two end edges of the source is greater than or equal to a quarter of a width of the gate.

5. The semiconductor device according to claim 1, wherein at least one end of the source is disposed as a concave structure, and wherein a projection of the via hole on a plane of the substrate does not overlap or partially overlaps a projection of the source on the plane of the substrate.

6. The semiconductor device according to claim 5, wherein one of i) the source is formed on a surface at a side of the semiconductor device away from the substrate, and ii) a recess for accommodating the source is disposed at a side of the semiconductor layer away from the substrate, the source located in the recess.

7. The semiconductor device according to claim 5, wherein each of two ends of the source is provided with one said via hole, and a distance between two said via holes provided at two end edges of the source is greater than or equal to a quarter of a width of the gate.

8. The semiconductor device according to claim 1, wherein an interconnecting metal layer is disposed on a surface of the source and the second semiconductor layer away from the substrate.

9. The semiconductor device according to claim 8, wherein the second semiconductor layer is a portion of the semiconductor layer in a region where the interconnecting metal layer and the inactive region overlap.

10. The semiconductor device according to claim 1, wherein a barrier layer is disposed at a side of the first semiconductor layer and the second semiconductor layer away from the substrate at a position corresponding to the via hole.

11. The semiconductor device according to claim 10, wherein an interconnecting metal layer is disposed on a surface at a side of the source, the second semiconductor layer, and the barrier layer away from the substrate.

12. The semiconductor device according to claim 10, wherein one of i) the source is formed on a surface at a side of the semiconductor device away from the substrate, and ii) a recess for accommodating the source is disposed at a side of the semiconductor layer away from the substrate, the source located in the recess.

13. The semiconductor device according to claim 10, wherein each of two ends of the source is provided with one said via hole, and a distance between two said via holes provided at two end edges of the source is greater than or equal to a quarter of a width of the gate.

14. The semiconductor device according to claim 1, wherein one of i) the source is formed on a surface at a side of the semiconductor device away from the substrate, and ii) a recess for accommodating the source is disposed at a side of the semiconductor layer away from the substrate, the source located in the recess.

15. The semiconductor device according to claim 14, wherein the source is formed in the recess, and wherein a height difference between a bottom surface of the via hole located in the second semiconductor layer and a surface of the semiconductor layer away from the substrate is smaller than or equal to 250 nm.

16. The semiconductor device according to claim 1, wherein each of two ends of the source is provided with one said via hole, and wherein a distance between two said via holes provided at two end edges of the source is greater than or equal to a quarter of a width of the gate.

17. The semiconductor device according to claim 1, wherein one-sixth to five-sixths of the volume of the via hole is located in the second semiconductor layer.

18. The semiconductor device according to claim 1, wherein an edge of the second semiconductor layer is arc-shaped.

19. A method for manufacturing a semiconductor device, the method comprising:
   providing a substrate;
   forming semiconductor layers at a side of the substrate to form an active region and an inactive region, the semiconductor layers comprising a first semiconductor layer located in the active region and a second semiconductor layer located in the inactive region;
   forming a source, a drain, and a gate in the active region, at a side of the semiconductor layer away from the substrate;
   forming an interconnecting metal at a side of the source away from the semiconductor layer and a side of the second semiconductor layer away from the substrate; and forming a via hole penetrated through the substrate, at least a part of the first semiconductor layer, and at least a part of the second semiconductor layer from a side of the substrate away from the semiconductor layers.

20. The method for manufacturing a semiconductor device according to claim 19, wherein the method further comprises:

prior to forming the interconnecting metal, forming an etching stopping layer at a side of the semiconductor layers away from the substrate, the etching stopping layer located above the via hole.

* * * * *